US006943564B2

(12) United States Patent
Yoshida et al.

(10) Patent No.: US 6,943,564 B2
(45) Date of Patent: Sep. 13, 2005

(54) ACTIVE-DRIVE TYPE PIXEL STRUCTURE AND INSPECTION METHOD THEREFOR

(75) Inventors: Takayoshi Yoshida, Yonezawa (JP); Shozaburo Sakaguchi, Yonezawa (JP)

(73) Assignee: Tohoku Pioneer Corporation, Yamagata (JP)

( * ) Notice: Subject to any disclaimer, the term of this patent is extended or adjusted under 35 U.S.C. 154(b) by 0 days.

(21) Appl. No.: 10/764,576

(22) Filed: Jan. 27, 2004

(65) Prior Publication Data

US 2004/0183791 A1 Sep. 23, 2004

(30) Foreign Application Priority Data

Jan. 31, 2003 (JP) ....................................... 2003-023034

(51) Int. Cl.[7] ................................................ G01R 31/00

(52) U.S. Cl. ....................... 324/658; 324/681; 324/769; 345/204

(58) Field of Search ................................ 324/658, 681, 324/769; 345/204

(56) References Cited

U.S. PATENT DOCUMENTS 6,262,589 B1 * 7/2001 Tamukai ..................... 324/770
6,791,350 B2 * 9/2004 Taguchi ...................... 324/770

FOREIGN PATENT DOCUMENTS

JP 2506840 4/1996

* cited by examiner

*Primary Examiner*—David Vu
(74) *Attorney, Agent, or Firm*—Westerman, Hattori, Daniels & Adrian, LLP

(57) ABSTRACT

In an active-drive type pixel structure comprising at least TFT for control, TFT for drive, and a capacitor for charge retention, it can be easily inspected whether the functions of TFTs and the capacitor are normal or not. In an active-drive type pixel structure comprising TFT (Tr1) for control, TFT (Tr2) for drive, and a capacitor for charge retention, one terminal of a dummy load W for inspection is connected to a drain of the TFT for drive, and the other terminal of the load W is connected to a line 3 for inspection. By measuring an electric current Id obtained on the line 3 for inspection while changing a voltage supplied to a data line 2*a*, it can be inspected whether the functions of TFTs and the capacitor are normal or not. The dummy load W is configured to be melted and cut by burning off the load W with a laser beam or by passing a predetermined electric current in the load W after completion of inspection.

15 Claims, 7 Drawing Sheets

ACTIVE-DRIVE TYPE PIXEL STRUCTURE AND INSPECTION METHOD THEREFOR

BACKGROUND OF THE INVENTION

1. Field of the Invention

The invention relates to an active-drive type pixel structure comprising at least TFTs (Thin Film Transistors) for control and drive, and a capacitor for charge retention, and to an inspection method therefor. More particularly, the invention relates to an active-drive type pixel structure and to an inspection method therefor, in which it is possible easily to inspect, before a pixel is formed, for example, a light emitting element is deposited, whether the functions of the above-described TFTs and that of the capacitor for charge retention are normal or not.

2. Description of the Related Art

A display using a display panel comprising light emitting elements arranged in a matrix has been widely developed. Organic EL (electro-luminescence) element using an organic material for a light emitting layer has been noticed as a light emitting element used for such a display panel. The reason is that the element has had very great practical utility, high efficiency, and a long life by using, for the light emitting layer of the EL element, an organic compound by which excellent light emitting characteristics can be expected.

There has been proposed, as a display panel which uses the organic EL element, a simple matrix type display panel in which the EL elements are simply arranged in a matrix and an active matrix type display panel in which each of the EL elements arranged in a matrix is provided with active elements comprising TFT. The latter active matrix type display panel can advantageously realize less electricity consumption and more reduced cross talk between pixels in comparison with those of the former simple matrix type display panel, and, especially, is suitable for a high-definition display forming a large screen.

FIG. 1 shows a most basic circuit structure for one pixel 10 in a conventional active matrix type display and the structure has been called as a conductance control method. In FIG. 1, a gate G of TFT (Tr1) for control, which comprises n-channels, is connected to a scanning line 1*a* from a scanning driver 1 and its source S is connected to a data line 2*a* from a data driver 2. And, a drain D of the TFT (tr1) for control is connected to the gate G of TFT (Tr2) for drive, which comprises P-channels, and also to one terminal of a capacitor C1 for charge retention.

Moreover, a source S of the TFT (Tr2) for drive is connected to the other terminal of the above-described capacitor C1, and also to a power supply at the side of an anode (VHanod) which supplies a driving electric current to an organic EL element E1 as a light emitting element. Furthermore, a drain D of the TFT (tr2) for drive is connected to an anode of the above-described organic EL element E1, and a cathode of the EL element in question is connected to a power supply at the side of a cathode (VLcath).

The TFT (Tr1) for control passes, from the source to the drain, an electric current corresponding to a data voltage (V data) which is supplied from the data line 2*a* to the source, when an ON-state control voltage (Select) is supplied to the gate of the TFT (Tr1) for control in FIG. 1 through the scanning line 1*a*. Accordingly, the above-described capacitor C1 is charged during the ON-state voltage at the gate of the TFT (Tr1) for control, and the voltage is supplied to the gate of the TFT (Tr2) for drive. Then, the TFT (Tr2) for drive passes the electric current based on the gate voltage and the source voltage to the EL element E1 and the element E1 is driven into light emitting.

Moreover, though the TFT (Tr1) for control is put into a so-called CUT-OFF state when the voltage of the gate of the TFT (Tr1) for control becomes an OFF-state voltage and the drain of the TFT (Tr1) for control is put into an open state, the gate voltage of the TFT (Tr2) for drive is maintained by charges accumulated in the capacitor C1, the driving electric current is maintained, and light emitting of the EL element E1 is maintained till the next scanning.

The above-described configuration shows one connection configuration example of the pixel 10 by the conductance control method, in which an image is reproduced by arranging a number of the pixels 10 in the vertical and horizontal directions and controlling each pixel for turning on or off, based on an image signal.

Incidentally, defects of TFT and a capacitor in each pixel cause a defect in pixels in this kind of the active matrix type display panel. Though it is unavoidable in the present situation to cause some defects in the display panel, the quality of the display panel is deteriorated to make the panel unsuitable as a commodity when the number of defects increases.

Therefore, if it is possible easily to inspect the above-described TFTs and capacity for charge retention for defects in the state of a semi-processed product before a state in which the above-described TFTs and capacitor for charge retention are deposited on a substrate, that is, a state in which an organic EL element as a light emitting element is formed on the above-described substrate, it is possible to improve a yield rate of the display panel. As a result, it is possible to contribute to the cost reduction. Especially, in comparison with the case of AM-LCD (active matrix type liquid crystal display) in which only one TFT is required for each pixel, inspection for defects in the above-described state of a semi-processed product becomes more important in AM-OEL (active matrix type organic EL display) in which equal to or more than two through four pieces of TFTs are required for each pixel.

On the other hand, since the capacitor for charge retention is a load of TFT for a pixel (TFT for drive) even in the above-described state of a semi-processed product, that is, in the state of the TFT substrate, it is comparatively easy in AM-LCD to execute inspection for defects even in the state of a TFT substrate. However, the TFT for drive is in a no-load state in the case of AM-OEL because the organic EL element is not deposited on the TFT substrate in the above-described state of a semi-processed product. Accordingly, it is not easy in such a state to execute inspection for defects of pixels.

Accordingly, a method, in which a probe is contacted to a predetermined picture element electrode and the like to measure impedance for inspection of defects of pixels, has been proposed in Japanese Patent Publication NO. 2506840 (after the 15th line in the second column and FIG. 6). Therefore, there is considered a similar method in which, in order to inspect pixels for defects, a load is connected to the TFT for drive for example, by contacting a conductive pin and the like with an electrode on which the above-described EL element is formed as a light emitting element.

Incidentally, it is unfavorable that there is increased possibility to cause defects of the light emitting elements, for example, by deteriorating the above-described electrode when an operation of contacting the conductive pin and the like with the electrode on which the above-described EL element is formed as a light emitting element is executed in a process of inspecting pixels for defects as described above. Moreover, though it is considered to use a method in which a load is given to the TFT for drive in a non-contact state by putting an electrode for inspection closer to the electrode, on which the light emitting element is formed, to form a capacitor between both the electrodes, it is difficult to use the method in an actual manner because gap adjustment between both the electrodes is extremely delicate.

SUMMARY OF THE INVENTION

The invention has been made to solve the above problems, and the object of the invention is to provide an active-drive type pixel structure and an inspection method therefor, by which defects of the above-described TFTs and capacity for charge retention can be inspected by use of, for example, a state of a semi-processed product in which a dummy load for inspection is deposited on a substrate.

A first aspect of the active-drive type pixel structure according to the invention which has been made for solving the above-described problems is a structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of the TFT for drive, and the other terminal of the dummy load is connected to a line for inspection, as described in claim 1.

And, a second aspect of the active-drive type pixel structure according to the invention is a structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of TFT for drive, and the other terminal of the dummy load is connected to a gate of TFT for drive, as described in claim 2.

Furthermore, a third and a fourth aspects of the active-drive type pixel structure according to the invention are a structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of TFT for drive, and the other terminal of the dummy load is connected to a source or a gate of TFT for control, as described in claim 3.

On the other hand, a first aspect of the inspection method of an active-drive type pixel structure according to the invention which has been made for solving the above-described problems is a method of an active-drive type pixel structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of TFT for drive, and the other terminal of the dummy load is connected to a line for inspection, and a method which has: a step in which TFT for control is put into an ON state; and a step in which a value of an electric current passing in the dummy load for inspection is measured while changing any one of a gate voltage, or a source one of TFT for drive, or a line voltage of a line for inspection or changing two or more of the voltages in a relative manner to one another, as described in claim 4.

Moreover, a second aspect of the inspection method of an active-drive type pixel structure according to the invention is a method of an active-drive type pixel structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of TFT for drive, and the other terminal of the dummy load is connected to a gate of TFT for drive, and a method which has: a step in which TFT for control is put into an ON state; and a step in which a value of an electric current passing in the dummy load for inspection is measured while changing either of a gate voltage, or a source one of TFT for drive, or changing both of the voltages in a relative manner to each another, as described in claim 8.

In addition, a third and a fourth aspect of the inspection method of an active-drive type pixel structure according to the invention are a method of an active-drive type pixel structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of TFT for drive, and the other terminal of the dummy load is connected to a source or a gate of TFT for control, and a method which has: a step in which TFT for control is put into an ON state; and a step in which a value of an electric current passing in the dummy load for inspection is measured while changing any one of the gate voltage or the source one of TFT for drive, or a voltage at the other terminal of the dummy load, or changing two or more of the voltages in a relative manner to one another, as described in claim 12. And, in the inspection method of an active-drive type pixel structure according to the invention, the dummy load for inspection is processed to be put into a high impedance state after a step in which the value of the electric current passing in the dummy load for inspection is measured, as described in claim 13.

DESCRIPTION OF THE PREFERRED EMBODIMENTS

Figure 1:
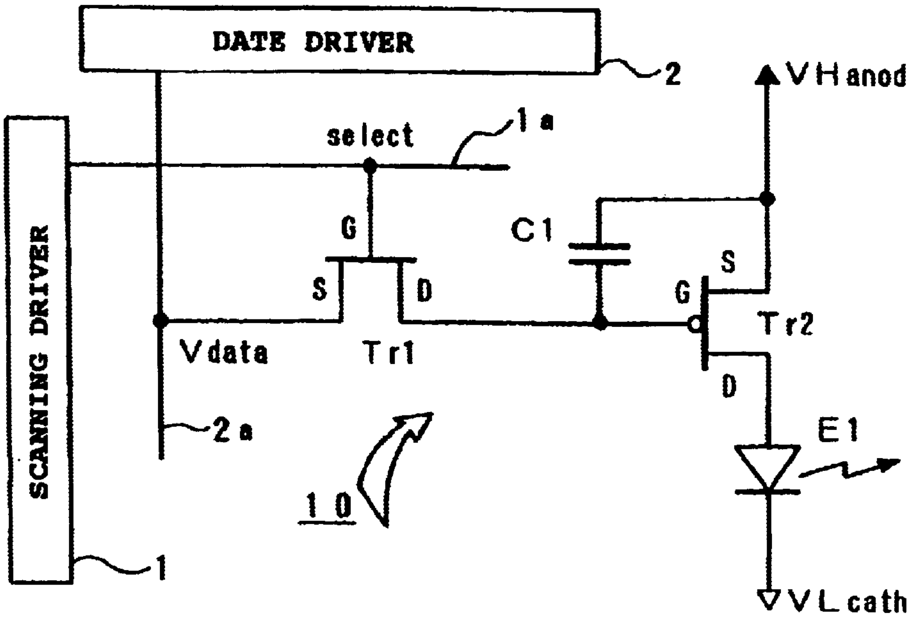
FIG. 1 PRIOR ART
FIG. 1 is a connection diagram showing a basic circuit configuration for one pixel in a conventional active matrix type display.

Hereinafter, an active drive type pixel structure and an inspection method therefor according to the invention will be explained, based on embodiments shown in drawings. Here, in the following explanation, parts similar to those previously explained in FIG. 1 are denoted by the same reference numbers as those in FIG. 1. Therefore, explanation of individual functions and operations will be suitably eliminated.

Figure 2:
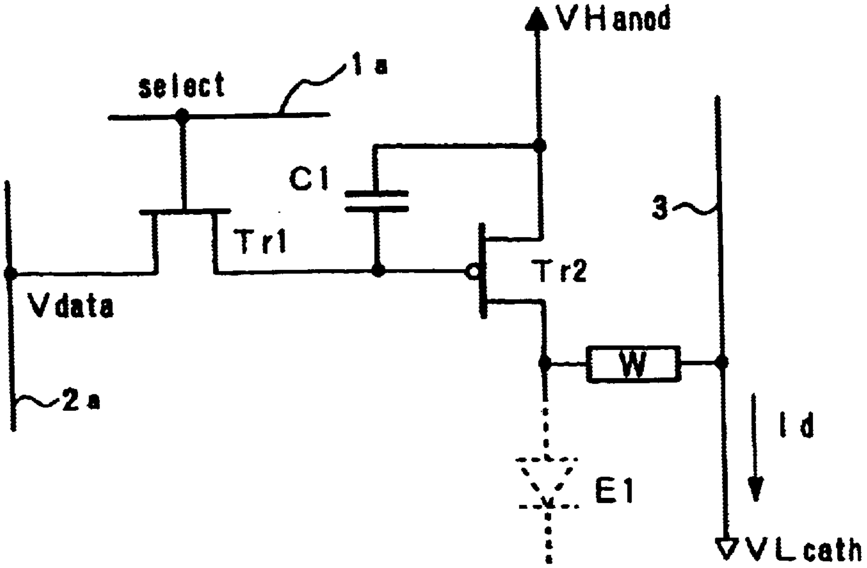
FIG. 2 is a connection diagram showing a first embodiment of the active drive type pixel structure according to the invention.

In the first place, FIG. 2 shows a first embodiment of the active drive type pixel structure according to the invention. The embodiment shown in FIG. 2 shows a similar circuit structure called as a conductance control method to that of FIG. 1. And, FIG. 2 shows a state of a semi-processed product of an organic EL element E1 before a state in which the element E1 is deposited.

The first embodiment shown in FIG. 2 has a configuration in which one terminal of a dummy load W for inspection is connected to a drain as an electric current output terminal of TFT (Tr2) for drive, and the other terminal of the dummy load W is connected to a line 3 for inspection. That is, the dummy load W for inspection and the line 3 for inspection are newly provided in comparison with the configuration of FIG. 1. And, an electric current measuring means is provided between the line 3 for inspection and a power supply (VLcath) at the side of a cathode as described later, and it is inspected by measuring an electric current value flowing in the dummy load W where the functions of each TFT (Tr1 and Tr2) and a capacitor C1 for charge retention are normal or not. That is, a value of an electric current flowing in the dummy load W is configured to be measured through the line 3 for inspection in this embodiment.

Here, in the first place, a potential difference of about 15 V is required in order to drive the EL element E1 for light emitting, considering the potential of each point in the circuit structure according to the above-described conductance control method. Then, in order to realize a driving operation at a voltage which is as low as possible to a reference potential (ground potential), there is a practical configuration, for example, in which 10 V is set for a power supply (VHanod) at the side of an anode of the EL element, and, for example, −5 V is set for a power supply (VLcath) at the side of a cathode of the EL element.

With regard to a gate voltage of TFT for drive which is required for ON-OFF control of TFT for drive (Tr2) in the above-described voltage conditions to be set, a potential of 10 V is required as the lowest one to make TFT be in an OFF state because TFT for drive is a P channel. Moreover, ON control of TFT for drive can be realized by applying potential which is considerably lower than the above-described voltage of 10 V, for example, ground potential (=0 V). Thereby, with regard to a data signal voltage Vdata which is supplied to a source of TFT (Tr1) for control, VHdata=10 V is set as high-level potential, and VLdata=0 V is done as low-level potential, respectively, according to the above-described conditions.

On the other hand, a control (selectable) voltage of 12 V which is obtained by adding at least a threshold voltage of 2 V to VHdata=10 V is required to be supplied to the gate of TFT (Tr1) in order to supply the above-described VHdata or VLdata in a selective manner to the gate of TFT (Tr2) for drive. And, TFT (Tr1) for control concerned can be in a cut off state at non-scanning by applying, for example, ground potential (=0 V) to the gate of TFT (Tr1) for control.

In the first place, potential by which TFT (Tr1) for control can be in an ON state, that is, the above-described voltage of 12 V is applied to a scanning line 1*a* in order to inspect a pixel function in the embodiment shown in FIG. 2, based on the above-description consideration. When the potential of a data line 2*a* is gradually decreased (swept) from 10 V (=VHanod) under such conditions, the state of TFT (Tr2) for control is gradually changed to ON. Here, FIG. 3 shows a process in which the state of TFT for drive is gradually changed to ON.

Figure 3:
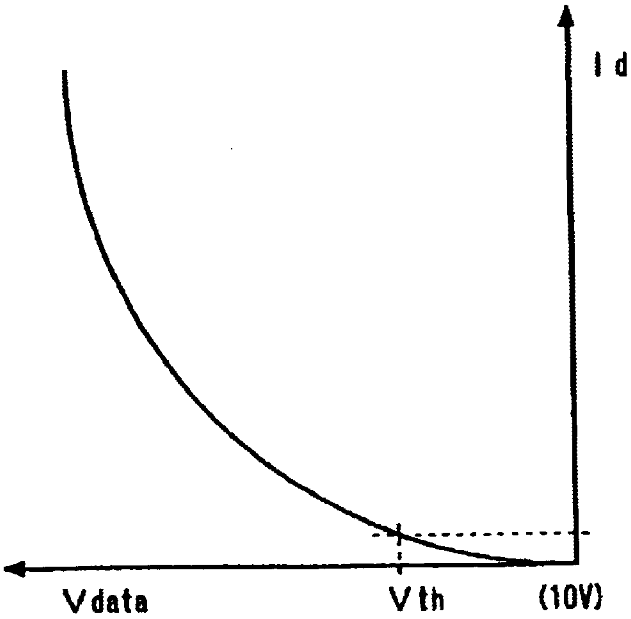
FIG. 3 is a characteristic graph showing an operation of TFT for drive in the configuration shown in FIG. 2.

That is, the horizontal axis shown in FIG. 3 indicates voltages applied to the data line 2*a* (source of TFT for control) and the potential shown as Vdata is decreased from 10 V in the left direction. And, the vertical axis shown in FIG. 3 indicates an electric current value Id which passes in the power supply (VLcath) at the side of the cathode from the drain of TFT (Tr2) for drive through the dummy load W and the line 3 for inspection. Accordingly, a characteristic shown in FIG. 3 is approximately equal to an Id-Vgs characteristic of TFT (Tr2) for drive (voltage characteristic between a drain electric current and a voltage between the gate and the source).

Here, the above-described electric current Id passing through the line 3 for inspection can be obtained by the electric current measuring means provided between the line 3 for inspection and the power supply (VLcath) at the side of the cathode, though not specifically shown in the drawings. Accordingly, when the electric current passes on the line 3 for inspection, or conversely when the electric current keeps passing on the line 3 for inspection regardless of the value of the data line voltage (Vdata), it is judged that any one of the above-described TFTs (Tr1 and Tr2) and the capacitor C1 is defective. And, it is decided that TFT (Tr2) for drive is defective if a Vgs value (=Vth: threshold voltage), at which an electric current Id with a predetermined value passes, exceeds a specified voltage.

A panel is judged to be a non-defective article if each pixel is evaluated and a number of defective pixels in the panel is with in a specified number, and the panel is judged to be defective goods if the number of defective pixels exceeds the specified number. When the inspection is completed as described above, the dummy load W connected to each TFT for drive is processed so that the load W is put into a high impedance state. That is, the dummy load is processed to be idle by execution of the above-described processing because an electrically short-circuit state is caused by the above-described dummy load W when an EL element is deposited to form a light-emitting display panel.

As one example in which the above-described dummy load W is processed to be put into a high impedance state, the dummy load for inspection is considered to be destroyed (burned off) by a laser beam. Thereby, electric connection between the drain of each TFT for drive and the line 3 for inspection is terminated. Moreover, means by which a dummy load for inspection is fused by passing a predetermined electric current in a dummy load W for inspection is preferably adopted, though explanation will be given in detail in the after-described embodiment. On the other hand, the above-described dummy load W for inspection may be an element, TFT, or an element such as a diode, which have the same function as that of a so-called fuse which is fused when an electric current equal to or larger than a predetermined current passes, other than a simple wire and a simple resistance.

Here, the current Id passing in the dummy load W, that is, the electric current Id passing on the line 3 for inspection is configured to be measured by changing the potential Vdata of the data line 2*a*, in other words, by changing the gate voltage of TFT (Tr2) for drive in the above explained inspection method of the first embodiment. However, an I–V (electric current-voltage) characteristic, as shown in FIG. 3, of TFT for drive can be obtained even by changing a line voltage (VLcath) applied to the line 3 for inspection or a driving voltage (VHanod) supplied to the source of TFT for drive (Tr2) in a separate manner, or by changing two or more of the above-described voltages in a relative manner to one another. Thereby, it can be inspected in the same manner as the above-described case whether the function of TFTs (Tr1 and Tr2), or the capacitor C1 of each pixel is normal or not.

Figure 4:
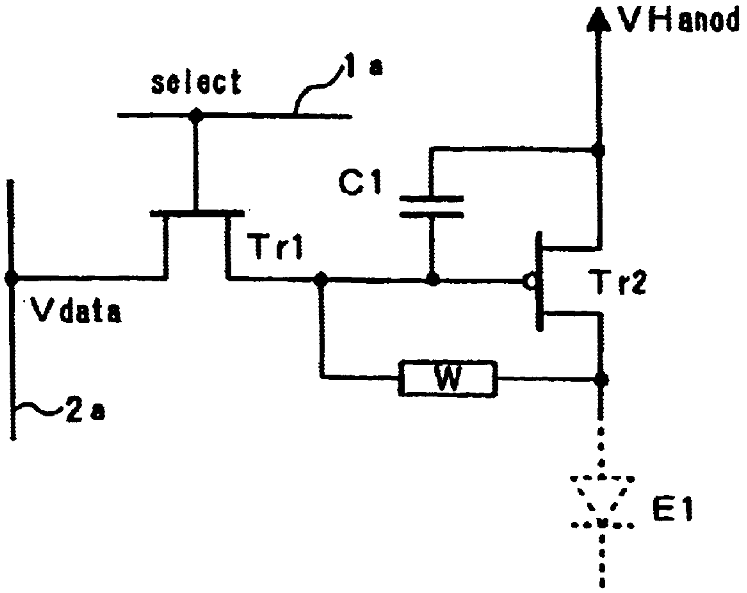
FIG. 4 is a connection diagram showing a second embodiment of the active drive type pixel structure according to the invention.

Subsequently, FIG. 4 shows a second embodiment of the active drive type pixel structure according to the invention. The embodiment shown in FIG. 4 shows a similar circuit structure called as a conductance control method to that of FIG. 1. In the same manner as that of the first embodiment, FIG. 4 shows a state of a semi-processed product of an organic EL element E1 before a state in which the element E1 is deposited. In the second embodiment, one terminal of a dummy load W for inspection is connected to a drain as an electric current output terminal of TFT (Tr2) for drive, and the other terminal of the dummy load W is connected to a gate of TFT (Tr2) for drive.

And, an electric current measuring means is configured to be provided between a data line 2*a* and a not-shown power supply (equivalent to the data driver 2 in FIG. 1) which supplies a data line voltage (Vdata) to the data line 2*a* and to measure a value of an electric current passing on the data line 2*a*. The data line electric current in this case is obtained after a drain electric current Id of TFT (Tr2) for drive passes through the dummy load W and TFT (Tr1) for control. Accordingly, the above-described data line electric current is approximately corresponding to the drain electric current Id of TFT (Tr2) for drive.

Figure 5:
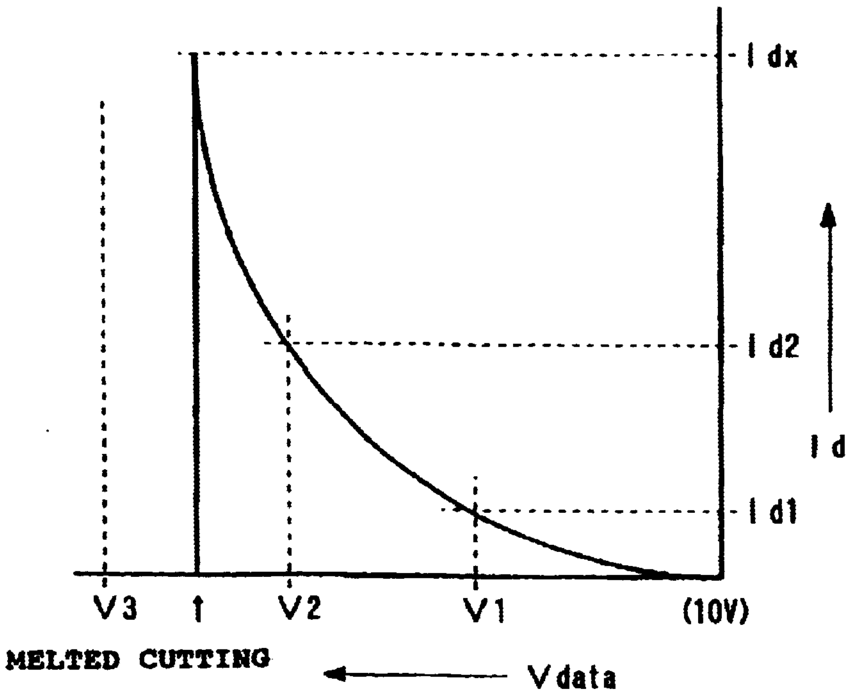
FIG. 5 is a characteristic view showing an operation of TFT for drive in the configuration shown in FIG. 4.

In the same manner as that of the first embodiment shown in FIG. 2, a voltage by which TFT (Tr1) for control can be in an ON state, for example, 12 V is applied to a scanning line 1*a* in order to inspect a pixel in a pixel configuration shown in FIG. 4. Under such a condition, the voltage of data line 2*a* is sequentially changed to V1, V2 and V3. That is, each value of the above-described V1, V2, and V3 are changed so that the voltage levels are changed in dropping order within a range below the level of 10V (=VHanod) at which TFT (Tr2) for drive is put into a cut-off state. FIG. 5 shows a changing state of the data line electric current (drain electric current Id of TFT for drive) at this time. Here, the characteristics are similar to those of FIG. 3 which have already been explained.

As shown in FIG. 5, a value of an electric current value Id1 when V1 is supplied as a voltage of the data line 2*a* and a value of an electric current value Id2 when V2 is supplied as a voltage of the data line 2*a* are measured, and, when the electric current values Id1, Id2 are within the specified ranges, respectively, it is judged that the functions of TFT (Tr1 and Tr2) and capacitor C1 are normal. Here, an element with a similar function to that of a so-called fuse which is fused when an electric current equal to or larger than a predetermined electric current Idx passes is adopted as the above-described dummy load W in this embodiment in this embodiment.

Then, V3 is supplied to the data line 2*a*, as shown in FIG. 5. Potential shown as V3 is supplied as gate bias of the TFT (Tr2) for drive and a drain electric current at this time is set so that an electric current equal to or larger than the above-described Idx passes. Accordingly, the above-described dummy load W is fused by the drain electric current of TFT for drive. At this time, it is confirmed through the data line 2*a* whether the above-described drain electric current Id is approximately zero or not. That is, the quality of each pixel is judged according to the above-described process. Then, the quality of each panel is judged in the same manner as that of the embodiment which has been explained, referring to FIG. 2 and FIG. 3.

Here, in the inspection method according to the above-described second embodiment, the electric current Id passing in the dummy load W is configured to be measured on the data line 2*a* by changing the potential Vdata of the data line 2*a*, in other words, by changing the gate voltage of TFT (Tr2) for drive. However, an I–V (electric current-voltage) characteristic, as shown in FIG. 5, of TFT for drive can be obtained even by changing the driving voltage (VHanod) supplied to the source of TFT (Tr2) for drive, or by changing both of the above potential Vdata of the above-described data line 2*a* and the driving voltage VHanod in a relative manner to each other. Thereby, it can be inspected even by such means, in the same manner as that of the first embodiment, whether the function of TFTs (Tr1 and Tr2), or the capacitor C1 of each pixel is normal or not.

Figure 6:
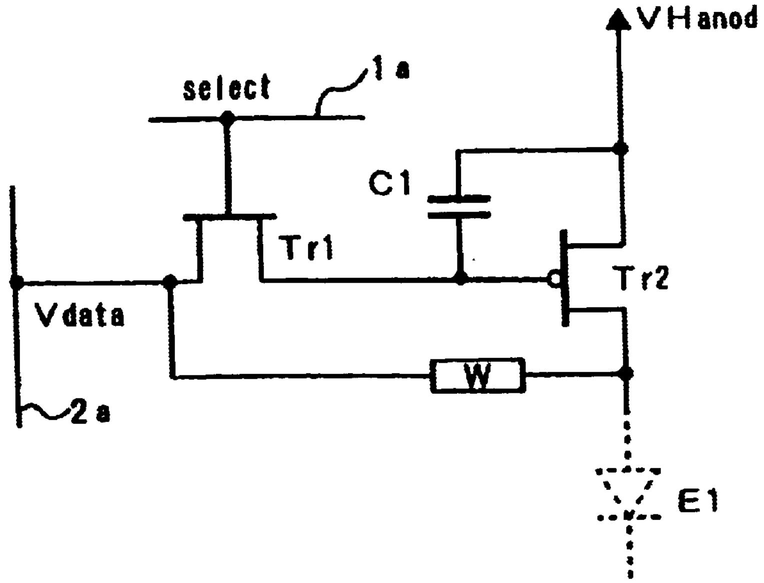
FIG. 6 is a connection diagram showing a third embodiment of the active drive type pixel structure according to the invention.

FIG. 6 shows a third embodiment of an active-drive type pixel structure according to the invention. The embodiment shown in FIG. 6 shows a similar circuit structure called as a conductance control method to that of FIG. 1. In the same manner as that of the first embodiment, FIG. 6 shows a state of a semi-processed product of an organic EL element E1 before a state in which the element E1 is deposited. In the third embodiment, one terminal of a dummy load W for inspection is connected to a drain as an electric current output terminal of TFT (Tr2) for drive, and the other terminal of the dummy load W is connected to a source of TFT (Tr1) for drive.

Even in this example, in the same manner as that of the example shown in FIG. 4, an electric current measuring means is configured to be provided between a data line 2*a* and a not-shown power supply which supplies a data line voltage Vdata to the data line 2*a*, and to measure a value of an electric current passing on the data line 2_a_. That is, the value of the electric current passing on the data line 2_a_ is corresponding to the drain electric current Id of TFT (Tr2) for drive in the same manner as that of the example shown in FIG. 4, and it can be inspected by checking a relation between the data voltage V data and the drain electric current Id whether the function of TFTs (Tr1 and Tr2), or the capacitor C1 of each pixel is normal or not.

Then, the dummy load W for inspection is configured to be fused by destroying (burning off) the load with a laser beam or by passing a predetermined electric current in the load W when the above-described measurement is completed. Even in this embodiment shown in FIG. 6, an I–V (electric current-voltage) characteristic of TFT for drive can be obtained by changing a driving voltage (VHanod). Accordingly, in a similar manner to the above-described case, it can be inspected even by adopting such means whether the function of TFTs (Tr1 and Tr2), or the capacitor C1 of each pixel is normal or not.

Here, the drain electric current Id of TFT for drive can be substantially obtained on the data line 2_a_ not through TFT (Tr1) for control according to the embodiment shown in FIG. 6, different from the embodiment shown in FIG. 4. Therefore, an advantage that TFT with remarkably high current-carrying capacity is not required to be formed as TFT (Tr1) for control can be obtained according to the embodiment shown in this FIG. 6.

Figure 7:
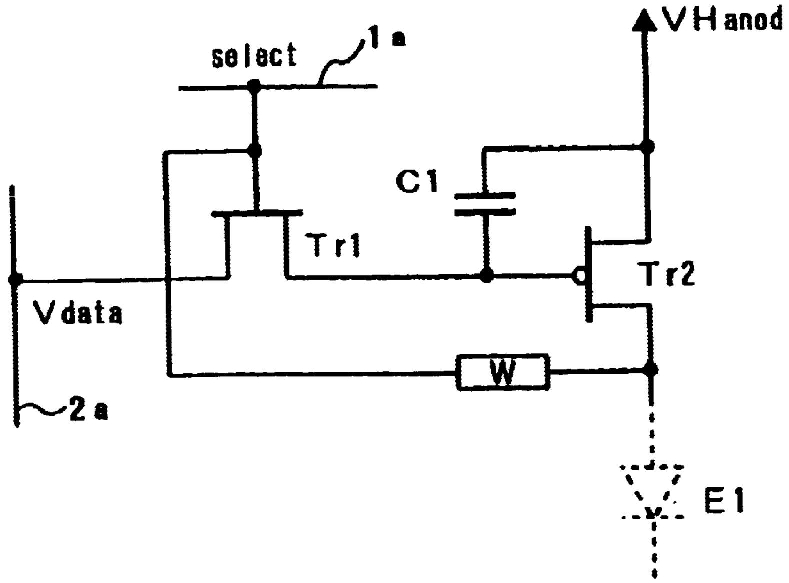
FIG. 7 is similarly a connection diagram showing a fourth embodiment.

FIG. 7 shows a fourth embodiment of an active-drive type pixel structure according to the invention. The embodiment shown in FIG. 7 shows a similar circuit structure called as a conductance control method to that of FIG. 1. In the same manner as that of the first embodiment, FIG. 7 shows a state of a semi-processed product of an organic EL element E1 before a state in which the element E1 is deposited. In the fourth embodiment, one terminal of a dummy load W for inspection is connected to a drain as an electric current output terminal of TFT (Tr2) for drive, and the other terminal of the dummy load W is connected to a source of TFT (Tr1) for drive.

In this example, a not-shown electric current measuring means is configured to be provided between a scanning line 1_a_ and a not-shown power supply (equivalent to the scanning driver 1 in FIG. 1) which supplies a control (selectable) voltage to the scanning line 1_a_ and to measure a value of an electric current passing on the scanning line 1_a_. In this case, the electric current passing on the scanning line 1_a_ is obtained after a drain electric current Id of TFT (Tr2) for drive passes through the dummy load W. Accordingly, the above-described electric current on the scanning line 1_a_ is approximately corresponding to the drain electric current Id of TFT (Tr2) for drive.

Here, a value of an electric current (substantially, the drain electric current Id of TFT for drive), which is corresponding to a data voltage Vdata to be added to a data line 2_a_ and passes on the scanning line 1_a_, is configured to be measured. Thereby, it can be inspected by checking a relation between the data voltage V data and the drain electric current Id whether the function of TFTs (Tr1 and Tr2), or a capacitor C1 of each pixel is normal or not.

In this case, the drain electric current Id of TFT for drive cannot be detected on the scanning line 1_a_ due to potential difference when a voltage by which TFT (Tr1) for control is put into a ON state, for example, the above-described voltage of 12 V is constantly applied to the scanning line 1_a_. Then, an ON voltage supplied to the gate of TFT (Tr1) for control through the scanning line 1_a_ is required to be controlled in a variable manner corresponding to the data voltage Vdata supplied to the data line 2_a_.

Then, the dummy load W for inspection is configured to be fused by destroying (burning off) the load W with a laser beam or by passing a predetermined electric current in the load W when the above-described measurement is completed. Even in this embodiment shown in FIG. 7, an I–V (electric current-voltage) characteristic of TFT for drive can be obtained by changing a driving voltage (VHanod). Accordingly, in a similar manner to the above-described case, it can be inspected even by adopting such means whether the function of TFTs (Tr1 and Tr2), or the capacitor C1 of each pixel is normal or not.

Here, the drain electric current Id of TFT for drive can be substantially obtained on the data line 2_a_ not through TFT (Tr1) for control according to the embodiment shown in FIG. 7, different from the embodiment shown in FIG. 4. Therefore, an advantage that TFT with remarkably high current-carrying capacity is not required to be formed as TFT (Tr1) for control can be obtained even according to the embodiment shown in this FIG. 7.

Figure 8:
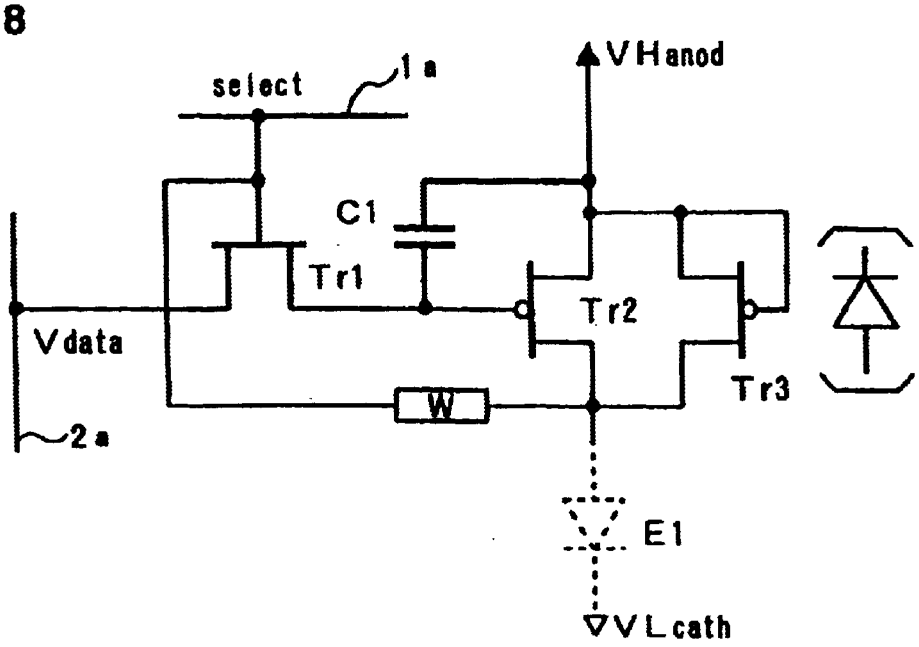
FIG. 8 is a connection diagram showing one example in which the invention is applied to a pixel with a configuration in which a reverse bias voltage is effectively applied to an EL element.

Subsequently, there is shown in FIG. 8 a configuration which is the same as the configuration shown in FIG. 7, though a diode element is further parallel-connected between the source and the drain of TFT (Tr2) for drive. That is, this invention is adopted as one example to a configuration in which a reverse bias voltage is configured to be applied in an effective manner to an EL element E1 by parallel connection of the diode element as described above. Here, TFT (Tr3) is used as the diode element in the example shown in FIG. 8 to form a diode element in an equivalent manner by short-circuit between the gate and the source of TFT (Tr3).

The diode element is arranged as described above, and the reverse bias voltage is effectively applied to the EL element E1 through the above-described diode element, for example, by exchanging VHanod and VLcath as the driving voltage source at predetermined timing. Thereby, the lifetime of the EL element can be extended. Here, means for applying a reverse bias voltage as shown in FIG. 8 has been filed as Japanese Patent Application No. 2002-230072 by the applicant of this invention. Accordingly, a similar advantage to that of the configuration example shown in FIG. 7 can be obtained even in the configuration shown in FIG. 8.

Figure 9:
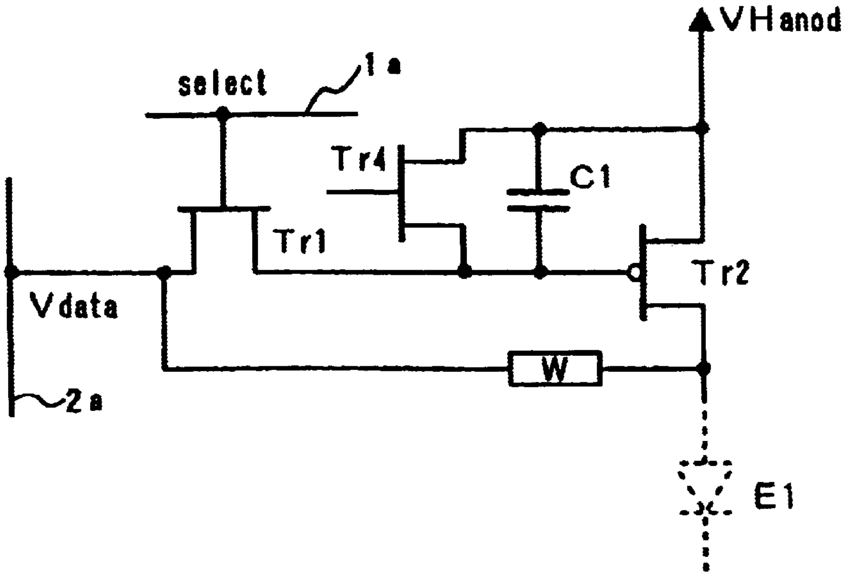
FIG. 9 is a connection diagram showing one example in which the invention is applied to a pixel with a configuration according to SES method.

FIG. 9 shows an example in which the invention is applied to a pixel configuration which comprises three TFT methods to realize digital gradation. A driving method for the configuration is also called as SES (Simultaneous-Erasing-Scan) and comprises TFT (Tr4) for erase in addition to TFT (Tr1) for control and TFT (Tr2) for drive. TFT (Tr4) for erase can discharge electric charge by ON operation of the TFT (Tr4) in the middle of the lighting period of an EL element E1. Thereby, gradation driving can be realized to control the lighting period of the EL element E1.

Even in the configuration shown in FIG. 9, one terminal of a dummy load W for inspection is connected to a drain as the electric current output terminal of TFT (Tr2) for drive, and the other terminal of the dummy load W is connected to a source of TFT (Tr1) for drive in the same manner as that of the example shown in FIG. 6. Accordingly, a similar advantage to the one explained based on FIG. 6 can be obtained even in the configuration shown in FIG. 9.

Figure 10:
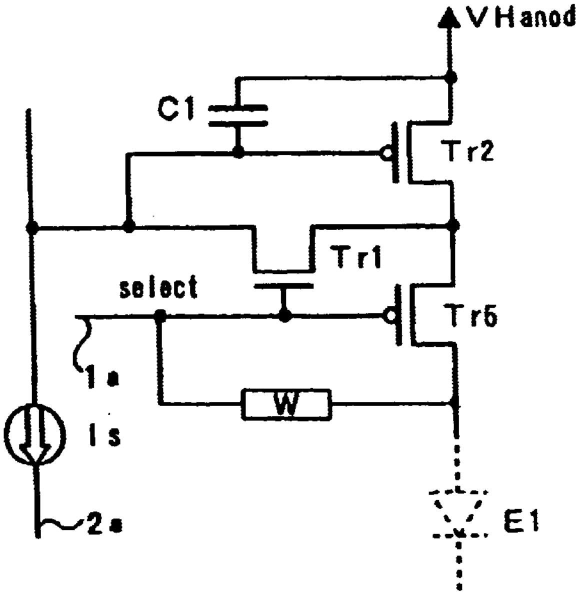
FIG. 10 is a connection diagram showing one example in which the invention is applied to a pixel with a configuration according to an electric-current programming method.

FIG. 10 shows an example in which the invention is applied to a pixel configuration according to an electric-current programming method. The electric-current programming method has a configuration in which TFT (Tr5) for switching is connected to a drain of TFT (Tr2) for drive, and an EL element E1 is formed at a drain of TFT (Tr5) for switching. And, a capacitor C1 for charge retention is connected between the source and the gate of the TFT (Tr2) for drive, and TFT (Tr1) for control is connected between the gate and the drain of TFT (Tr2) for drive.

Furthermore, an electric current source Is for write is connected to the source of TFT (Tr1) for control. Additionally, each gate of TFT (Tr1) for control and TFT (Tr5) for switching is connected to a scanning line 1*a*. The above-described electric current source Is for write has a function to control an electric current on a data line 2*a*.

In the configuration shown in FIG. 10, one terminal of a dummy load W for inspection is connected to the drain of TFT (Tr5) for switching, and the other terminal of the dummy load W is connected to the gate of TFT (Tr1) for control. Therefore, a drain electric current Id of TFT (Tr2) for drive passes in the dummy load W through TFT (Tr5) for switching, and the drain electric current Id can be measured on the scanning line 1*a* according to this configuration. Thereby, a similar advantage to the one explained based on FIG. 7 can be obtained even in the configuration shown in FIG. 10.

Figure 11:
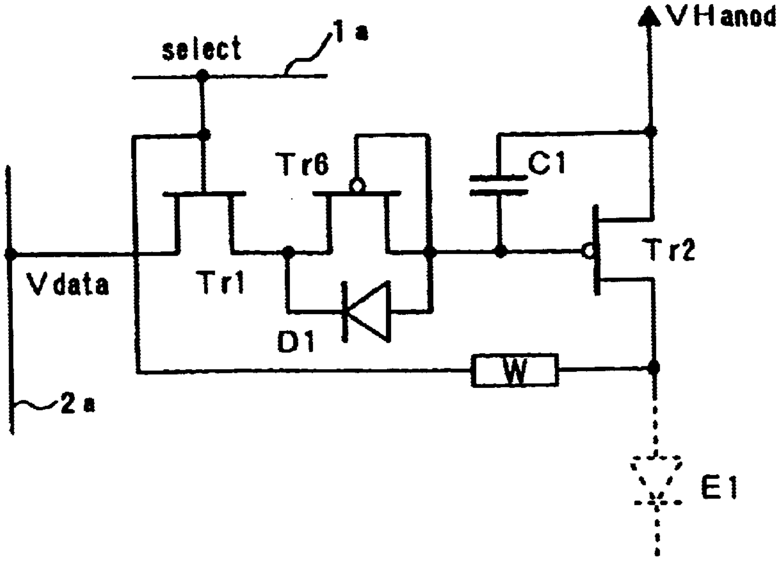
FIG. 11 is a connection diagram showing one example in which the invention is applied to a pixel with a configuration according to a threshold voltage correction method.

Then, assuming that a configuration in FIG. 11 is based on a method called as a threshold voltage correction method, FIG. 11 shows an example in which the invention is applied to a pixel configuration according to a threshold voltage correction method. The threshold voltage correction method shown in FIG. 11 has similar basic components to those of the conductance control method shown in FIG. 7. But, a circuit in which a diode element D1 is parallel-connected between the source and the drain of TFT (Tr6) is inserted between TFT (Tr1) for control and TFT (Tr2) for drive in comparison with the configuration of the conductance control method. Here, the above-described TFT (Tr6) has a configuration in which the gate and the drain are in a short-circuit state to realize a function as an element supplying a threshold characteristic from TFT (Tr1) for control to the gate of TFT (Tr2) for drive.

According to the configuration, the threshold characteristic of TFT (Tr2) for drive can be effectively cancelled by the threshold characteristic generated by TFT (Tr6). Even in this embodiment, one terminal of a dummy load W for inspection is connected to the drain of TFT (Tr2) for drive, and the other terminal of the dummy load W is connected to the gate of TFT (Tr1) for control.

Therefore, a drain electric current Id of TFT (Tr2) for drive can be measured on a scanning line 1*a* even in the configuration shown in FIG. 11. Thereby, a similar advantage to the one explained based on FIG. 7 can be obtained even in the configuration shown in FIG. 11.

Figure 12:
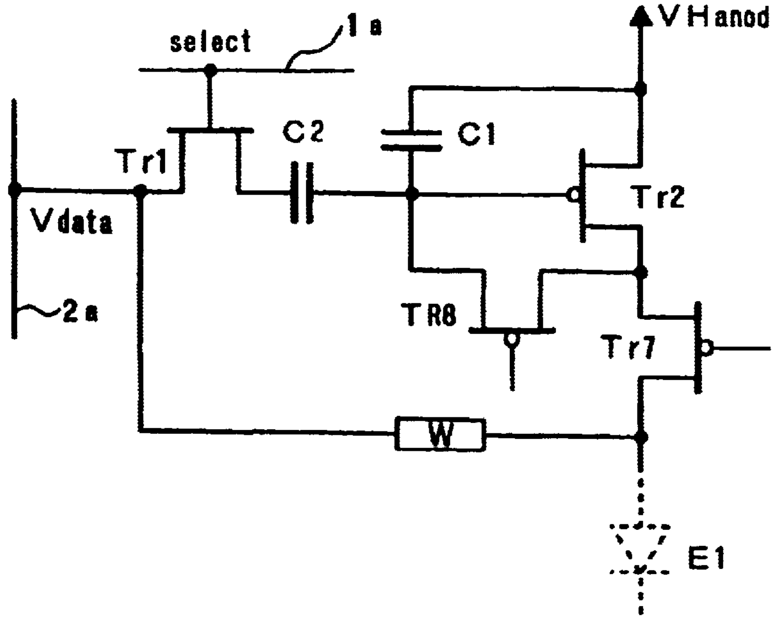
FIG. 12 is a connection diagram showing one example in which the invention is applied to a pixel with a configuration according to a voltage programming method.

FIG. 12 shows an example in which the invention is applied to a pixel configuration according to a voltage programming method. In the voltage programming method, TFT (Tr7) for switching is connected to a drain of TFT (Tr2) for drive, and, furthermore, TFT (Tr8) for switching is connected between a drain and a gate of TFT (Tr2) for drive.

Additionally, the voltage programming method has a configuration in which a data signal is supplied from a data line 2*a* to the gate of TFT (Tr2) for drive through TFT (Tr1) and a capacitor C2.

In the above-described voltage programming method, TFT (Tr7) and TFT (Tr8) are put into an ON state to secure an ON state of TFT (Tr2) for drive. TFT (Tr7) is put into an OFF state at the next moment to sneak a drain electric current Id of TFT (Tr2) for drive into the gate of TFT (Tr2) for drive through TFT (Tr8). Thereby, a voltage between the gate and the sources is increased until the voltage between the gate and the source of TFT (Tr2) for drive becomes equal to the threshold voltage of TFT for drive. TFT (Tr2) for drive is put into an OFF state when both the voltages become equal.

Then, the voltage between the gate and the source is maintained in a capacitor C1 by which the drain electric current of TFT for drive is controlled. That is, the voltage programming method has a configuration in which the scatter in the threshold voltages in TFT (Tr2) for drive is compensated.

In the above-described configuration shown in FIG. 12, one terminal of a dummy load W for inspection is connected to the drain of TFT (Tr7) for drive, and the other terminal of the dummy load W is connected to the source of TFT (Tr1) for control. Accordingly, the drain electric current Id of TFT (Tr2) for drive can be detected on the data line 2*a* through TFT (Tr2) and the dummy load W. Therefore, a similar advantage to the one explained based on FIG. 6 can be obtained even in the configuration shown in FIG. 12.

Figure 13:
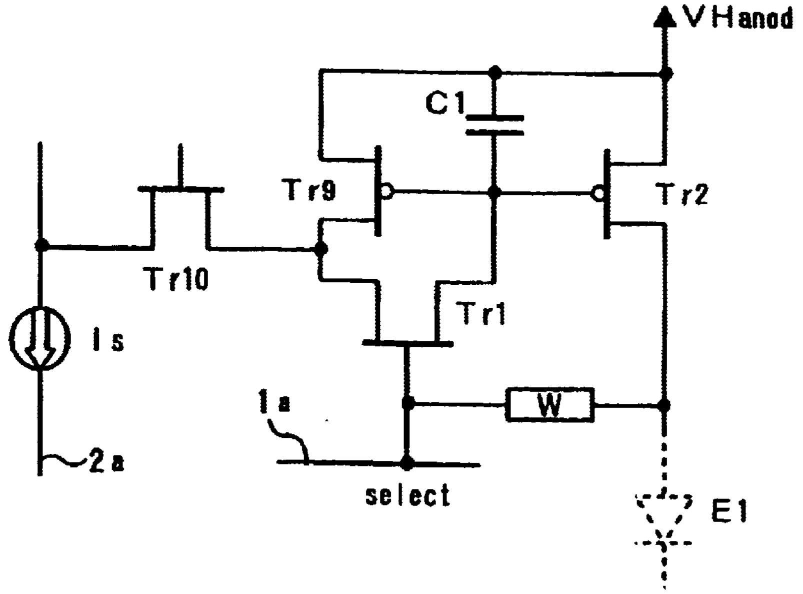
FIG. 13 is a connection diagram showing one example in which the invention is applied to a pixel with a configuration according to a current mirror method.

FIG. 13 shows an example in which the invention is applied to a pixel configuration according to a current mirror method. In the current mirror method, TFT (Tr2) for control, which comprises P channels, and TFT (Tr9), which also comprises P channels, are symmetrically provided under common gate connection, and a capacitor C1 for charge retention is connected between the gates and the sources of both of TFTs (Tr2 and Tr9).

Moreover, TFT (Tr1) for control is connected between the gate and the drain of the above-described TFT (Tr9), and TFTs (Tr2 and Tr9) function as a current mirror by ON operation of TFT (Tr1) for control. That is, ON operation of TFT (Tr10) for switching, which comprises N channels, is configured to be executed together with ON operation of TFT (Tr1) for control. Thereby, an electric current source Is for write is configured to be connected to TFT (Tr9) through TFT (Tr10) for switching.

Then, an electric current path along which an electric current passes from the power supply VHanod to the electric current source Is for write through TFT (Tr9) and TFT (Tr10) is formed during an address period. And an electric current corresponding to the electric current passing in the electric current source Is is generated as the drain electric current Id of TFT (Tr2) for drive by the current mirror operation.

The gate voltage of TFT (Tr9), which corresponds to the value of the electric current passing in the electric current source Is for write, is written into the capacitor C1 by such an operation. And, TFT (Tr1) for control is put into an OFF state after a predetermined value of a voltage is written in the capacitor C1, and TFT (Tr2) for drive operates so that a predetermined drain electric current Id is supplied, based on charges accumulated in the capacitor C1.

Moreover, in the embodiment shown in FIG. 13, one terminal of a dummy load W for inspection is connected to the drain as the electric output terminal of TFT (Tr2) for drive, and the other terminal of the dummy load W is connected to the source of TFT (Tr1) for control. Accordingly, the drain electric current Id of TFT (Tr2) for drive can be measured on a scanning line 1*a* even in the configuration shown in FIG. 13. Therefore, a similar advantage to the one explained based on FIG. 7 can be obtained even in the configuration shown in FIG. 13.

What is claimed is:

1. An active-drive type pixel structure comprising at least: TFT for control by which control output is generated, based on potential of a data line; TFT for drive in which a driving electric current is controlled, based on the control output; and a capacitor for charge retention in which the control output is temporarily maintained, wherein one terminal of a dummy load for inspection is connected to an electric output terminal of the TFT for drive, and the other terminal of the dummy load is connected to a line for inspection.

2. An active-drive type pixel structure comprising at least: TFT for control by which control output is generated, based on potential of a data line; TFT for drive in which a driving electric current is controlled, based on the control output; and a capacitor for charge retention in which the control output is temporarily maintained, wherein one terminal of a dummy load for inspection is connected to an electric output terminal of the TFT for drive, and the other terminal of the dummy load is connected to a gate of the TFT for drive.

3. An active-drive type pixel structure comprising at least: TFT for control by which control output is generated, based on potential of a data line; TFT for drive in which a driving electric current is controlled, based on the control output; and a capacitor for charge retention in which the control output is temporarily maintained, wherein one terminal of a dummy load for inspection is connected to an electric output terminal of the TFT for drive, and the other terminal of the dummy load is connected to a source or a gate of the TFT for control.

4. An inspection method of an active-drive type pixel structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of the TFT for drive, and the other terminal of the dummy load is connected to a line for inspection, wherein the method has:

a step in which the TFT for control is put into an ON state; and a step in which a value of an electric current passing in the dummy load for inspection is measured while changing any one of a gate voltage, or a source one of the TFT for drive, or a line voltage of a line for inspection or changing two or more of the voltages in a relative manner to one another.

5. The inspection method of an active-drive type pixel structure according to claim 4, wherein the dummy load for inspection is processed to be put into a high impedance state after the step in which the value of the electric current passing in the dummy load for inspection is measured.

6. The inspection method of an active-drive type pixel structure according to claim 5, wherein means for destroying the dummy load for inspection by a laser beam is adopted as means by which the dummy load for inspection is processed to be put into the high impedance state.

7. The inspection method of an active-drive type pixel structure according to claim 5, wherein means for fusing the dummy load for inspection by passing a predetermined electric current in the dummy load for inspection is adopted as means by which the dummy load for inspection is processed to be put into the high impedance state.

8. An inspection method of an active-drive type pixel structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of the TFT for drive, and the other terminal of the dummy load is connected to a gate of the TFT for drive, wherein the method has:

a step in which the TFT for control is put into an ON state; and a step in which a value of an electric current passing in the dummy load for inspection is measured while changing either a gate voltage, or a source one of the TFT for drive, or changing both of the voltages in a relative manner to each other.

9. The inspection method of an active-drive type pixel structure according to claim 8, wherein the dummy load for inspection is processed to be put into a high impedance state after the step in which the value of the electric current passing in the dummy load for inspection is measured.

10. The inspection method of an active-drive type pixel structure according to claim 9, wherein means for destroying the dummy load for inspection by a laser beam is adopted as means by which the dummy load for inspection is processed to be put into the high impedance state.

11. The inspection method of an active-drive type pixel structure according to claim 9, wherein means for fusing the dummy load for inspection by passing a predetermined electric current in the dummy load for inspection is adopted as means by which the dummy load for inspection is processed to be put into the high impedance state.

12. An inspection method of an active-drive type pixel structure which comprises at least: TFT for control by which control output is generated, based on potential of a data line; TFT for drive in which a driving electric current is controlled, based on the control output; and a capacitor for charge retention in which the control output is temporarily maintained, and in which one terminal of a dummy load for inspection is connected to an electric output terminal of the TFT for drive, and the other terminal of the dummy load is connected to a source or a gate of the TFT for control, wherein the method has:

a step in which the TFT for control is put into an ON state; and a step in which a value of an electric current passing in the dummy load for inspection is measured while changing any one of the gate voltage or the source one of the TFT for drive, or a voltage at the other terminal of the dummy load, or changing two or more of the voltages in a relative manner to one another.

13. The inspection method of an active-drive type pixel structure according to claim 12, wherein the dummy load for inspection is processed to be put into a high impedance state after the step in which the value of the electric current passing in the dummy load for inspection is measured.

14. The inspection method of an active-drive type pixel structure according to claim 13, wherein means for destroying the dummy load for inspection by a laser beam is adopted as means by which the dummy load for inspection is processed to be put into the high impedance state.

15. The inspection method of an active-drive type pixel structure according to claim 13, wherein means for fusing the dummy load for inspection by passing a predetermined electric current in the dummy load for inspection is adopted as means by which the dummy load for inspection is processed to be put into the high impedance state.

* * * * *